United States Patent
Candage

Patent Number: 5,359,301
Date of Patent: Oct. 25, 1994

[54] PROCESS-, TEMPERATURE-, AND VOLTAGE-COMPENSATION FOR ECL DELAY CELLS

[75] Inventor: Anthony B. Candage, Portland, Me.

[73] Assignee: National Semiconductor Corporation, Santa Clara, Calif.

[21] Appl. No.: 37,929

[22] Filed: Mar. 26, 1993

[51] Int. Cl.$^5$ .................. H03K 3/354; H03K 5/14
[52] U.S. Cl. ........................ 331/57; 307/602; 307/603; 307/605; 307/608; 307/304
[58] Field of Search .............. 331/57; 307/602, 603, 307/605, 606, 608, 304

[56] References Cited

U.S. PATENT DOCUMENTS

| | | | |
|---|---|---|---|
| 4,810,907 | 3/1989 | Tohyama | 307/304 X |
| 4,864,162 | 9/1989 | Maoz | 307/304 X |
| 4,988,960 | 1/1991 | Tomisawa | 331/57 X |
| 5,010,385 | 4/1991 | Shoemaker | 307/304 X |

Primary Examiner—Siegfried H. Grimm
Attorney, Agent, or Firm—Thomas L. Bohan; Stephen R. Robinson

[57] ABSTRACT

Low-cost apparatus and method for achieving a moderately-precise resistance value into an integrated circuit without the use of resistive trimming or complex feedback loops. The invention has direct application to the production of integrated BiCMOS circuits making use of Delay Lines and/or Voltage-Controlled Ring Oscillators where a ±10% tolerance in delay time or frequency is acceptable. When incorporated into a PLL, it also presents advantages where tighter tolerances are required, because of its low inherent jitter. By the use of a single off-chip component, this invention overcomes variations in the operating circuit otherwise arising from chip fabrication irregularities, power supply voltage fluctuations, and ambient temperature drift. In the Preferred Embodiment of the present invention, the resistive element is used as the load resistor of a high-frequency ECL delay cell; the element is a controlled MOSFET resistor in parallel with a fixed diffusion resistor. This parallel resistor is made into a compensated calibrated resistor by coupling it into a current mirroring circuit and an external resistor of a precise value. In its Preferred Embodiment, the invention combines the mirroring of current and resistance into a delay cell with the use of an oxide capacitor (a MOSCAP) as the capacitive part of the delay cell's RC time constant and in so doing achieves a delay cell with a delay time which is predictable to within ±10% without the use of any complex feedback loops, such as occur in a Phase-Locked Loop.

20 Claims, 6 Drawing Sheets

PROCESS-, TEMPERATURE-, AND VOLTAGE-COMPENSATION FOR ECL DELAY CELLS

BACKGROUND OF THE INVENTION

1. Field of the Invention

This invention relates generally to integrated circuits (ICs) requiring for their correct operation a resistance element with a value predictable to within a few percent regardless of variations in the manufacturing process, changes in the IC operating temperature, or fluctuations in the voltage of the power supply energizing the IC. More particularly, the invention relates to delay cell circuits dependent upon an RC time constant predictable to within ±10% and in which a premium is placed on minimizing feedback circuitry and off-chip components used to stabilize the delay time. More particularly yet, the invention relates to the use of such RC time constants in ECL delay cells used in delay lines and ring oscillators.

2. Prior Art

One of the tradeoffs for the benefits provided by high-density IC chip technology is that the variance from one chip to another in the behavior of nominally-identical circuit elements is huge when compared with what prevailed in the old discrete-element days. Furthermore, the forms of these elements which have been adapted to integrated production often have greater dependence on circuit operating temperature and power supply voltage levels than was the case with the discrete elements. The variance in the as-fabricated product arises from the nature of the integrated fabrication sequence and the fact that the various heat treatments needed to achieve a particular end configuration on a chip all are interrelated in their effects on the IC components contained within the chip.

Of the components displaying fabrication-related variations, resistors are perhaps the worst, with as-fabricated resistance tolerances being ±25% or more with respect to the nominal design resistance. Further, IC resistors will in general vary significantly in resistance during circuit operation in response to temperature changes. Fortunately, most circuits do not depend upon the absolute value of any particular resistance. They depend, rather, on ratios of resistances. Because of this, most variations in resistance values-whether due to fabrication vagaries, operating temperatures drift, or power-supply-voltage fluctuations-cancel out. One important category of exceptions to this situation is the delay cell circuit, widely used to produce propagation delays, usually in ring oscillator circuits. These propagation delays depend ultimately on RC time constants and consequently on the absolute value of a resistance. (They actually depend on the absolute value of the product of resistance and capacitance. To the extent that the capacitive element is affected by transistor junction capacitance, that element can also vary a great deal due to process, temperature, and voltage fluctuations.)

The present invention is directed toward producing an effective IC resistive element having a much lower dependence on the fabrication process and also a much lower dependence on operating temperature. Relatively speaking, it is a process-independent, temperature-independent resistance. More accurately described, it constitutes apparatus and method for producing a resistance which is compensated to first order for process and temperature fluctuations by a technique which itself is $V_{cc}$-independent. Because the greatest utility for such a resistance appears to lie with delay cells, the preferred embodiment of the present invention lies with delay cells. In this preferred embodiment, the compensated resistance of the present invention is coupled with a stable, low-tolerance capacitance so as to produce an RC element compensated for process, temperature, and voltage. Since the most common application of delay cells is to ring oscillators, the prior art most relevant to the present invention is that dealing with ring oscillators.

Because of the variance in as-fabricated RC values and also the variation of RC values with temperature and $V_{cc}$ (the power supply voltage), ring oscillators tend to produce uncorrected output frequencies which deviate significantly from the design frequency. Since ring oscillators are normally configured so that they are voltage-"tunable" (i.e., as voltage-controlled-ring-oscillators-VCROs), provision can be made for a feedback mechanism to lock the VCRO output frequency at any value within the capture range of the underlying circuit. The feedback mechanism generates an error voltage $V_{error}$ proportional to the phase-deviation between the VCRO output and some reference frequency; a VCRO stabilized in such a manner is a Phase-Locked Loop (PLL). This implies a ring oscillator input coupled to an element which provides a shift in the frequency in response to the voltage signal, $V_{error}$. Since the range in magnitude of the error signal is not large, the sensitivity of the frequency response to $V_{error}$—$\Delta f/\Delta V_{error}$—must be high, and the greater the potential frequency deviation from design, the higher $\Delta f/\Delta V_{error}$ must be. [Since the ring oscillator's operation depends on a series (cascade) of delay cells, the shift which is actually being effected is in delay time, T. Thus, the sensitivity can also be expressed by the size of $\Delta T/\Delta V_{error}$.] The disadvantage of a VCRO highly responsive to $V_{error}$ is that its frequency is also highly responsive to electrical noise and to power-supply-bounce-induced voltage changes in the circuit-which are passed through as phase jitter on the VCRO output.

Until a few years ago, IC delay cells predominantly used TTL circuitry, with the T-sensitive parameter being the supply voltage $V_{cc}$. For reasons which became increasingly important—including faster switching speeds, lower signal swings (and hence lower EMI problems), lower power dissipation—ECL-based delay cells offered advantages over the TTL circuitry. For many applications the ECL delay cell disclosed in U.S. Pat. No 4,876,519 (1989), issued to Davis et al. ("High Frequency ECL Voltage Controlled Ring Oscillator") has now become the standard. The ECL delay cell of Davis et al. depends for its $V_{error}$-sensitive element on the actual resistors—the load resistors— establishing the delay cell's RC time constant. More particularly, the Davis et al. device provides for the load resistors to be P-channel resistors coupled between $V_{cc}$ and the collectors of the emitter-coupled input transistors. The error voltage $V_{error}$ is then applied (though indirectly) to the gates of these load resistors in order to exercise the necessary T-control.

In spite of the advantages of the ECL delay cell of Davis et al., it shares with the TTL family of delay cells the wide as-fabricated frequency variance referred to above. Because the uncorrected frequency of the resultant ring oscillators may vary from the nominal design value by ±35% or more, the circuitry must have high sensitivity to $V_{error}$. Compounding the annoyance of the resulting jitter, the need for closed-loop control for the oscillator leads to a more complicated circuit on the chip and hence to an increase in the chip price beyond what it would otherwise be. Furthermore, it is not possible with present technology to put all of the feedback circuitry on the chip, leading to the frequent necessity of subsequently adding off-chip circuit components to the IC chip when the latter is incorporated into an extended circuit. This requirement further drives up the ultimate cost of production.

Ironically, many delay line and ring oscillator applications do not require the high precision of a PLL or its equivalent. Although the ±35% (or greater) variance in all of the relevant prior art is unacceptably large, a delay cell which could provide an uncorrected T predictable to within ±10% would satisfy the needs of many applications with no further correction, which means that the PLL—and all of the disadvantages it presents—represents overkill in those situations. Furthermore, for those applications requiring higher precision, a cell with an as-fabricated variance of ±10% will, when incorporated into a PLL, satisfy those applications with much less jitter than the present circuits. (I.e., with the narrow variance to be corrected, these cells would not require the high $\Delta T/\Delta V_{error}$ sensitivity of traditional, broad tolerance, cells.)

Therefore, what is needed is a circuit with an RC element presenting an as-fabricated predictability to within less than ±10% over the circuit's operating temperature range and power supply voltage fluctuation range. What is further needed is that this predictability be attained without complicated feedback circuitry—such as is present in a PLL—without any resistor-"trimming," and with a minimum dependence on off-chip components.

SUMMARY OF THE INVENTION

The present invention, through the use of but one off-chip component—a single precision resistor—produces an on-chip IC resistive element predictable to within a few percent without the need of complex feedback circuitry. When combined with an on-chip oxide capacitive element, this resistive element leads to an RC time constant predictable to within <±10%, an RC time constant which furthermore can be "set" by the resistance selected for the single off-chip resistor. Among other applications, the present invention allows for the production of medium-cost, medium-variance (±10%), high-frequency BiCMOS ECL delay cells adequate for most applications. Furthermore, the present invention leads to VCROs which can be incorporated into PLLs so as to produce low-jitter, highly frequency-precise constant swing outputs.

The resistive element of the present invention ("the calibrated resistor") depends upon using a MOSFET load resistor to provide a voltage sensitive resistance, analogous to the Davis et al. technology. The gate voltage of the MOSFET in the present invention is ultimately referenced to a precision off-chip resistor in such a way as to establish the value of the calibrated resistor to within a few percent of design regardless of variations in the fabrication process, in the power supply voltage, or in the operating temperature of the circuit. Although the scope of the invention includes a load resistor which is a MOSFET by itself, there are usually advantages to coupling the MOSFET in parallel to a fixed resistor, such as a simple diffusion resistor. Although this parallel-resistor configuration generally will be used in this discussion, it is to be understood that the invention is not limited to it.

Although the key to the present invention's application to delay cells lies in how it handles the RC resistive element it is nevertheless necessary to improve also on the RC capacitive element as well. Because the large inherent R-variations in those prior-art devices require closed loop frequency (i.e., RC) control, no incentive previously existed to address the capacitive variance by itself. In the prior-art delay cells and ring oscillators, the capacitive part of the RC was provided by the "parasitic" capacitance of the switching transistors, something which in general varies over a very large range. The capacitive part of the problem is addressed in the present invention by simply ensuring that the uncertain parasitic capacitance is dominated by a deliberately-provided, low-tolerance capacitor such as an oxide sandwich capacitor (a MOSCAP), which is stable against temperature and supply voltage and which can be produced and operated with a typical precision of ±5% or better, regardless of process, temperature, or $V_{cc}$.

The invention uses a current-mirroring/resistance-mirroring approach. It depends on the relatively uniform production of IC circuit elements within a single chip. FIG. 1 shows the underlying mechanism for achieving the resistance mirroring, anticipating a means of ensuring that I1=I2=I3 (that is, that the same current is flowing to GND through each of the three parallel couplings of a P-channel MOSFET and a diffusion resistor). The design resistance is the same for RA, RB, and RK. Furthermore, the MOSFET design parameters are the same for MA, MB, and MC. It is reasonable to assume that, to within the tolerances of interest here, as-fabricated resistors on the same chip and with the same design value will have the same actual resistance-though this resistance may vary considerably from the design value. Similarly for the MOSFETs. Therefore, since (1) the gate voltage is the same on MA, MB, and MC, (2) the values of the paired resistors RA, RB, and RK, respectively, are the same, and (3) the total current passing through each of the pairs MNRA, MB/RB, and MC/RK is the same, the resistance across each of the pairs is the same. The resistance across MNRA has been mirrored onto MB/RB, MC/RK, etc. By ensuring MA, MB, and MC are operating in their ohmic range, this approach can provide calibrated, stabilized resistive elements for an extended circuit. For example, MB/RB and MC/RK can provide the load resistances in a circuit requiring an RC time constant. It is the method of adjusting the resistance of MNRA which ensures that this resistive element is independent of fluctuations in the fabrication process, in the operating temperature, and in $V_{cc}$. The resistance mirroring is not perfect; e.g., it will not mimic the master resistive element if the MOSFET of the slave resistive element is not maintained in its ohmic region. Nevertheless, for small signal excursions—such as those involved in the delay cell, in particular—it is more than adequate.

Given the presence of the calibrated current I1=I2=I3, the resistance-mirroring itself is straightforward. It uses all on-chip circuitry, including a operational amplifier OP-AMPR and a means for generating a voltage $V_{setR}$ referenced to $V_{cc}$; i.e., $V_{setR}=V_{cc}-K$. (K is a voltage referenced to a Widler band gap cell or the like, independent of $V_{cc}$ fluctuations and—to at least first order—of temperature fluctuations.) $V_{setR}$ is connected to one of the inputs of OP-AMPR, the output of which serves as the gate bias $V_{GATE}$ for all of the MOSFETs, including MA. The feedback loop leading to the other OP-AMPR input will vary the MA gate voltage until the voltage drop across MA/RA is equal to K, i.e., so that the two input voltages to OP-AMPR are the same. Since the current through this combination is fixed at I1, this is the same as setting the MA/RA resistance to K/I1. This resistance set at MNRA and mirrored to the other parallel combinations downstream will be—by the nature of its generation—independent of fluctuations in $V_{cc}$ or temperature. This is the calibrated resistance of the present invention.

By varying I1 (=I2=I3), one can vary the calibrated resistance and hence set the characteristic time in a delay cell utilizing the calibrated resistance. The precision of this "set" is limited only by the precision with which I1 (=I2=I3) can be set. Delay time variations due to process-, temperature-, and $V_{cc}$-fluctuations are eliminated to the extent that the I1 setting is independent of these fluctuations. One method of setting and then mirroring a current is shown in FIG. 2. It is in this circuit that the only off-chip circuit element of the invention appears: a precision ($\pm 1\%$) resistor $R_p$, coupled into the feedback circuit for operational amplifier OP-AMPI, links one of the OP-AMPI inputs to GND. The other OP-AMPI input is from an on-chip sub-circuit—again, such as a Widler band-gap cell—producing a voltage referenced to GND. The output from OP-AMPI is coupled to the gate of MOSFET MD, the principal current path of which is coupled between $V_{cc}$ and the other input to OP-AMPI. That feedback loop produces a voltage drop across $R_p$ equal to $V_{setI}$. I.e., the MD gate is automatically biased by OP-AMPI to the point where the current through MD—and hence $R_p$—is $V_{setI}/R_p$. Circuit parameters are selected such that MD is operating in its saturation range, i.e., so that it acts as a current generator, independent to first order of its source-to-drain voltage drop.

The MD gate voltage is also applied to the gate of ME. ME is designed to be identical to MD except for a scaling factor, say S. Thus, in the steady state, the current through MD will be $V_{refI}/R_p$ and through ME, $SV_{refI}/R_p$. Because both MD and ME are operating in the saturation range, this current will not be affected by fluctuations in their source-to-drain voltages, at least not to first order. Furthermore, since the current is established by a band-gap-based reference voltage (or one with equivalent stability), it will not be subject to any variations in the as-fabricated values of the circuit elements. Note that this current is directly proportional to the value selected for $R_p$. Thus, the conditions set out above in the discussion of the mirrored resistance are satisfied; a calibrated resistance available for use in an RC time constant can be produced which, to first order and for small signals, is independent of fabrication process variations, of operating temperature changes, and of $V_{cc}$ fluctuations in the power supply energizing the circuit.

To overcome loading and ground-isolation problems, the calibrated current generated by the above-described method is introduced into the circuit containing the calibrated resistances by the buffering approach shown in FIG. 2. The current through ME goes to ground through bipolar transistor QB. The base drive current needed to turn on QB (and to permit it to pass the calibrated current from ME) is tapped off the emitter of QA. The emitter of QA is also coupled to the respective base nodes of QC, QD, and QE, which are designed to have the same characteristics. Furthermore, RD=RE=RF=RG=RH. In this manner the current through QB is mirrored into the branches containing the other bipolar transistors. This current of course is the same as through ME and therefore has been calibrated by the selection of $R_p$. The coupling points X1, X2, and X3 of FIG. 2 match the similarly-labelled points in FIG. 1.

PREFERRED EMBODIMENT OF THE INVENTION

Figure 1:
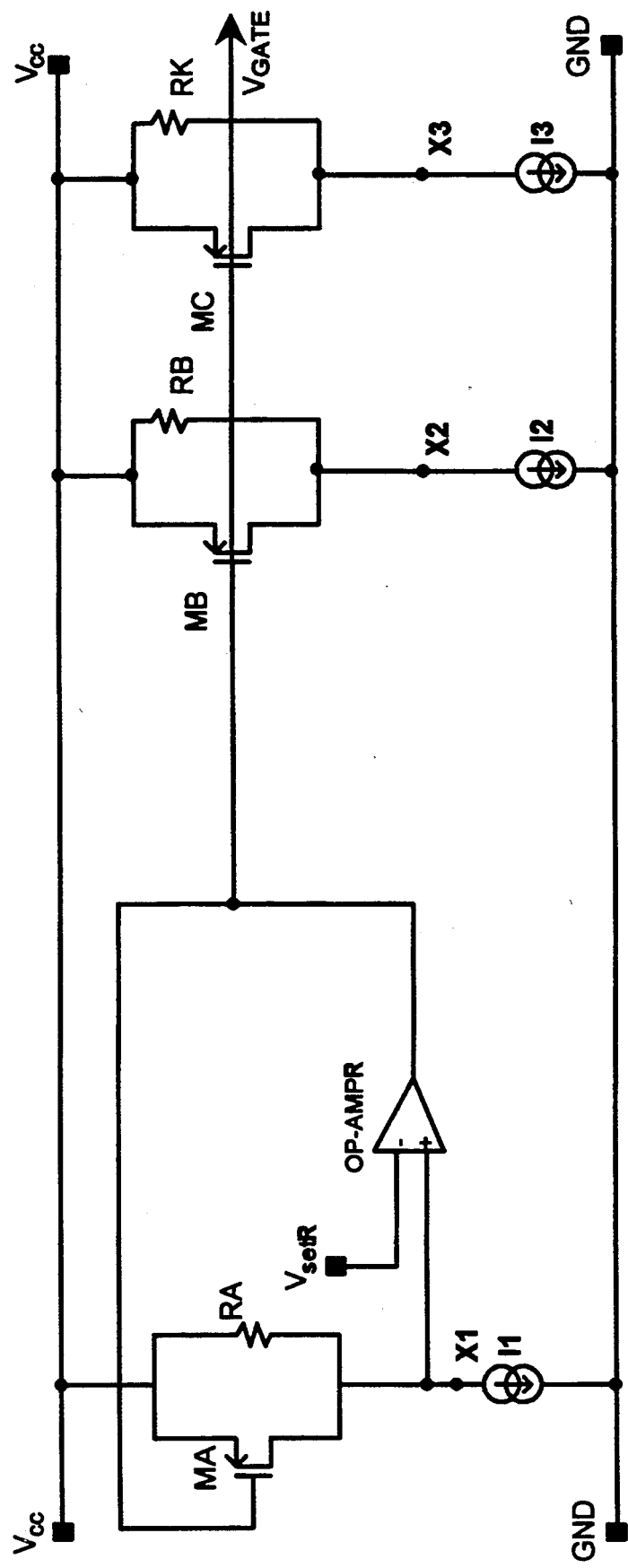
FIG. 1 is a schematic representation of the resistance-mirroring circuit of the present invention.
Figure 2:
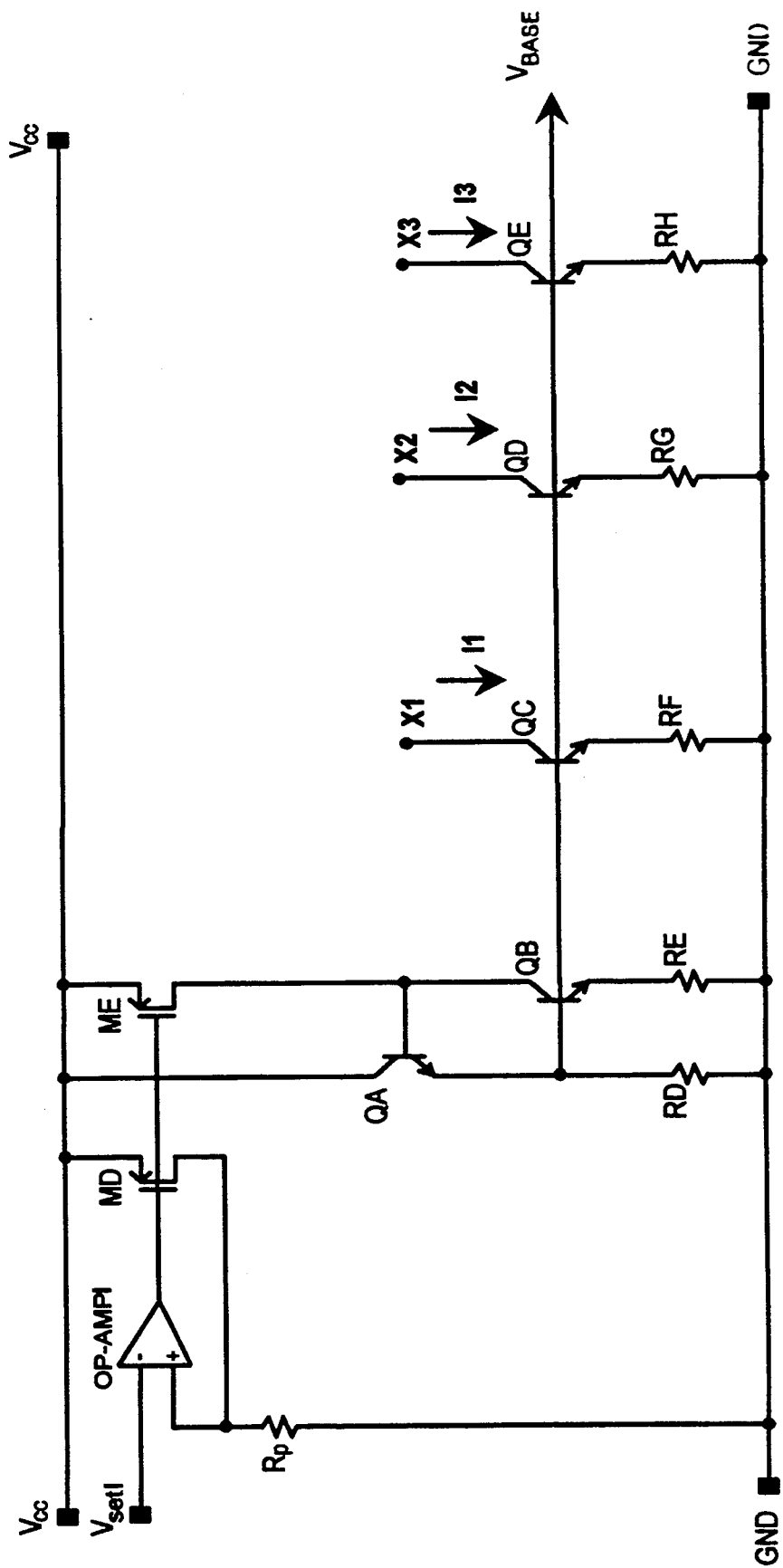
FIG. 2 is a schematic representation of the current-mirroring circuit of the present invention.
Figure 3:
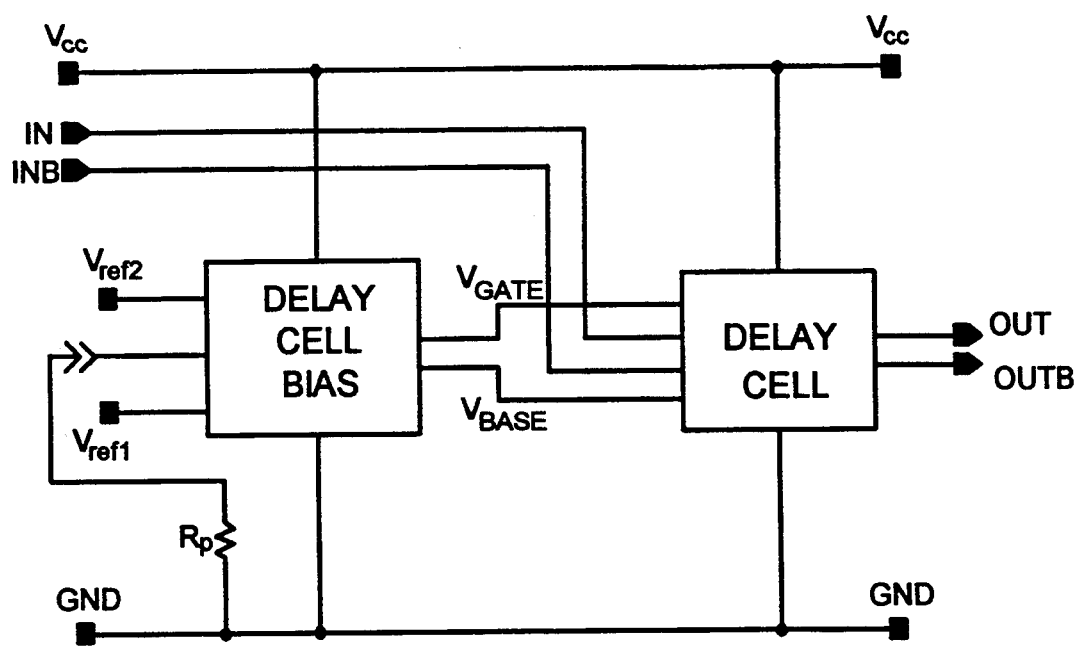
FIG. 3 is a block diagram of a delay cell utilizing the present invention and of the bias circuit used to mirror current and resistance into the delay line in the present invention.

In its Preferred Embodiment the invention is adapted for use in a high-frequency ECL BiCMOS delay cell. FIG. 3 is a block schematic diagram breaking down the circuit of the Preferred Embodiment into a DELAY CELL BIAS section for establishing the calibrated resistance and calibrated current and generating the biases—$V_{GATE}$ and $V_{BASE}$—needed to mirror them into a DELAY CELL section, containing an ECL delay cell incorporating the elements necessary to implement the invention. I.e., the first section generates the resistance and current to be mirrored; the second section contains the components needed to replicate the mirrored resistance and current. More generally, the delay cell is extended into a delay line which is simply a cascade of delay cells, all biased in parallel by the single delay cell bias circuit; however, all elements of the Preferred Embodiment can be illustrated through a single one of the delay cells. In what follows, the calibrated resistance will occasionally be referred to as the "master resistance" or the "master resistive element," in distinction to the slave resistive elements onto which it is mirrored. Similar master/slave terms will be used for the current.

Figure 4:
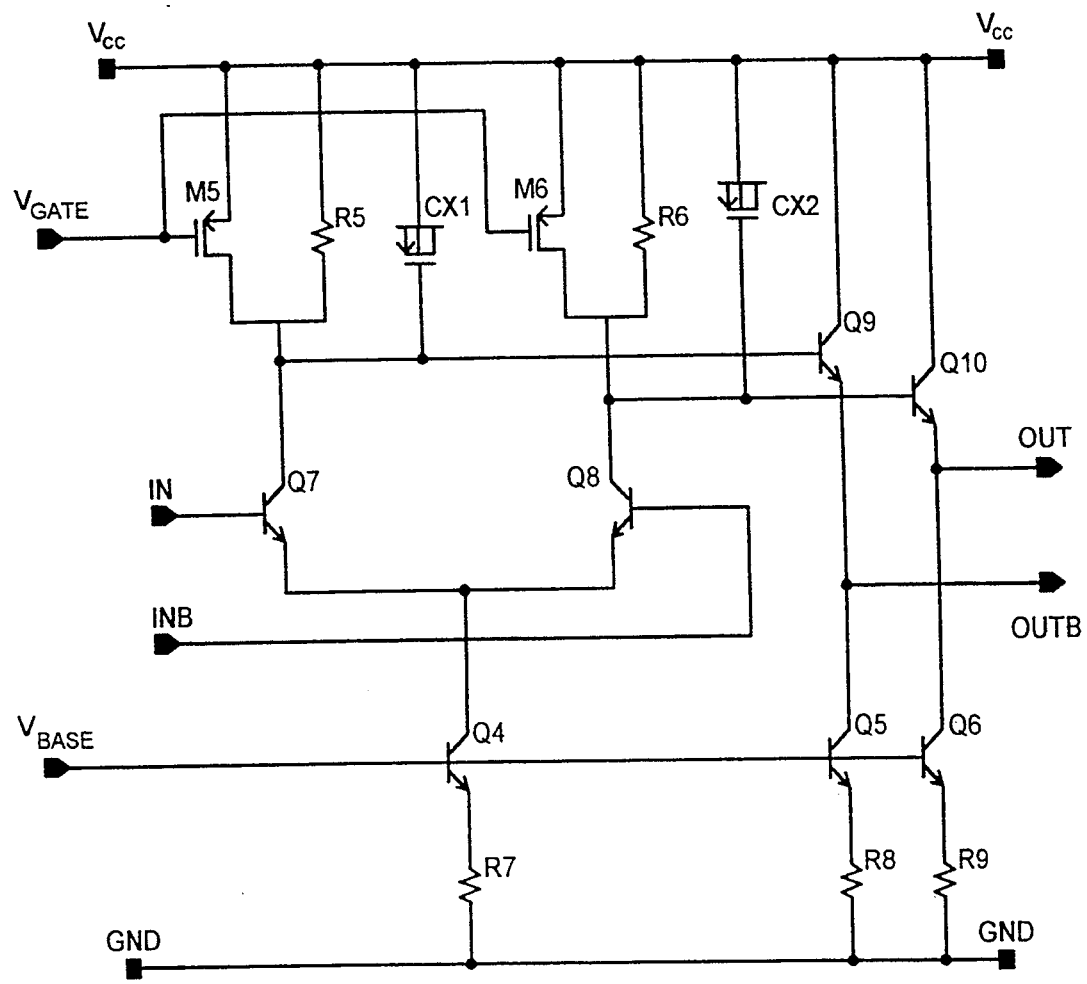
FIG. 4 is the circuit of a delay cell utilizing the calibrated resistance of the present invention.

FIG. 4 shows a schematic of the delay cell of the Preferred Embodiment. It is essentially an ECL delay buffer with the exception of the load elements, which are specific to the present invention. With continuing reference to FIG. 4, note the input and the complementary input, respectively, IN and INB. This is a differential input device (with the voltage difference between IN and INB input signals typically being about 0.4 v). Nevertheless, there will be a common reference voltage and the inputs can be stated in terms of that reference. In operation, a signal of alternating High and Low voltages is coupled to IN, thereby biasing the base of bipolar transistor Q7 and alternately turning Q7 on and off. Concurrently, a complementary signal is coupled through INB to the base of Q8 with effects complementary to those at Q7. Because of the current mirroring provided by this invention, Q7 and Q8 divide a fixed current, the mirrored, calibrated current flowing through Q4 and R7 to GND. That same calibrated current multiplied by a scaling factor flows through each of the output transistors Q9 and Q10. I.e., these output transistors are continuously conducting what is essentially a constant current.

As IN starts to rise, turning on Q7, current is diverted through Q7, reducing the current through M6/R6 and hence the voltage drop from $V_{cc}$ to the base of Q10. In other words, the voltage at the Q10 base node rises. This provides more base drive for Q10, reducing the collector-emitter voltage drop across Q10 and hence causing the voltage at OUT to rise. In other words, the emitter-follower output voltage at OUT varies in the same sense as the voltage at IN, though with a delay/distortion due to the load-cell RC time constant, as will be discussed.

Figure 5:
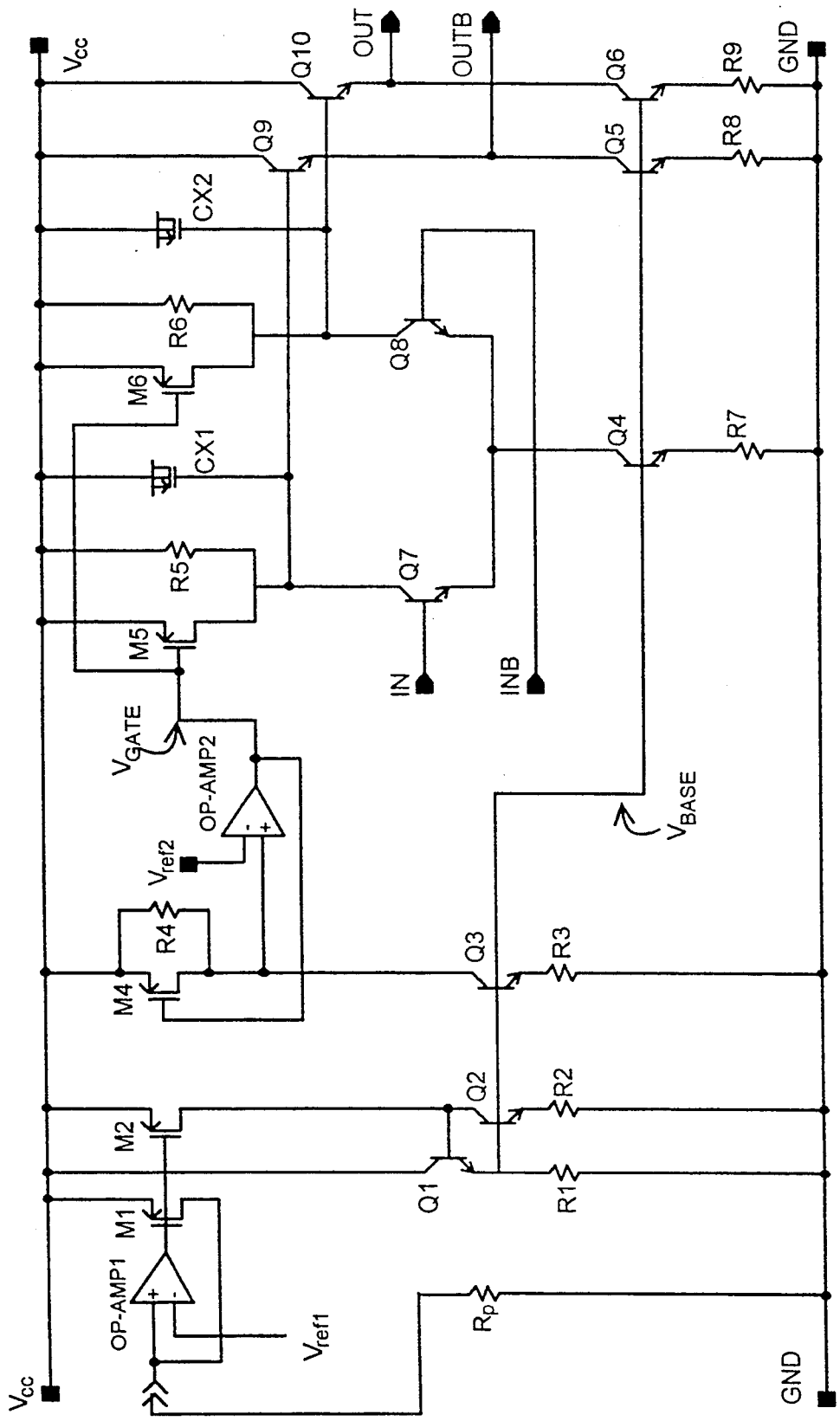
FIG. 5 is a diagram containing the basic elements of the preferred embodiment of the present invention, and shows the current-mirroring and resistance-mirroring circuits as well as an ECL delay buffer.

FIG. 5 shows the delay cell of FIG. 4 coupled to a particular version of the bias circuit described generally in SUMMARY OF THE INVENTION. Everything shown, with the exception of the precision resistor $R_p$, is on the chip. With the reference voltage $V_{ref2}$ selected—by known means, such as a Widler cell outside this particular circuit—to be $V_{cc}-0.4$ v, the master resistive element (M4 and R4 in parallel—M4/R4) is adjusted so that the voltage drop across it is 0.4 v; i.e., with the calibrated current flow in that resistive element, the voltage drop across the master resistive element is forced to be 0.4 v by an operational amplifier OP-AMP2 and $V_{ref2}=V_{cc}-0.4$ v. This in turn ensures that—through the application of the voltage level $V_{GATE}$—the slave resistive elements M5/R5 and M6/R6, respectively, display the same voltage drop of 0.4 v when the calibrated current is flowing through them. This is true to the extent that the three resistive elements are identical, and ideally they are. As stated, if they are designed to be identical, they are—to a very good approximation—identical within a particular chip. Since they are not absolutely identical, however, it is better practice to say that they are "nominally identical," which is to say that they have been designed to be identical. (Note that in this context "nominally" does not have the meaning sometimes imputed to it of "ostensibly but not actually.") In the Preferred Embodiment then, R7, R8, and R9 are nominally identical, R5 and R6 are nominally identical, CX1 is nominally identical to CX2 (when it comes to oxide capacitors, in contrast to other circuit elements, typical as-fabricated variances are very small across and between production runs as well as within a chip), M5 is nominally identical to M6, Q9 is nominally identical to Q10, and Q7 is nominally identical to Q8.

In principle, it is possible to simply use a P-Channel resistor by itself in each of the key resistive elements. In practice, many benefits are found in putting it in parallel with a fixed resistor, typically a diffusion resistor. This is because of the very large variance in the as-fabricated transconductance curves/values of MOSFETs. For a given gate bias, the resulting source to drain resistance can vary by as much as a factor of 3. Such a variance untempered by a diffusion resistor (which has an as-fabricated variance of "only" ±25%) would put much greater demands on the operational amplifier OP-AMP2. By including the parallel fixed resistor, the circuit can be made to function with much less attention devoted to the design and fabrication of the operational amplifier, and this is what is done in the Preferred Embodiment.

Because of the M6/R6-CX2 combination constituting an RC time constant, there is an effective delay in the rise time of OUT with respect to that of IN. (The RC time constant is established by, on the one hand, the precision oxide capacitor CX2 enhanced by the parasitic capacitances and, on the other, the resistance of the diffusion resistor R6 in parallel with the P-channel resistor M6.) More precisely, the rise at IN appears at OUT with a rolloff characteristic of the RC time constant. Because of the digital nature of the circuitry into which the delay cell ultimately feeds, wherein switching occurs at certain threshold voltage levels, this roll-off is tantamount to a true propagation delay. Similar statements hold for INB, the propagated signal from which appears at the base of Q10 and hence at OUTB.

With continuing reference to FIG. 4, it can be seen that emitter-follower output stages are used to provide buffering for the rest of the delay cell, and to prevent saturation of the input stage of the next delay cell in series (when a delay line is compiled). The individual delay cells will typically be cascaded into a string to form a delay line for effecting a total delay in the propagation time equal to the sum of the delay times of the individual cells. Hence, the emitter-follower outputs OUT and OUTB will form the inputs IN and INB of a following cell. The voltages at various points within the cell pertaining to IN High and IN Low for the Preferred Embodiment circuit can be understood as follows. After the switching transient is past, all of the calibrated current mirrored into the delay cell's tail circuit—Q4 and R7 in series—will pass through one or another of the load resistors. Say for definiteness that Q7 is fully on (so that Q8 is fully off). Then, for the reason set out above, the Q7 collector voltage and the Q9 base voltage will both be $V_{cc}-0.4$ v, or approximately 4.6 v, for $V_{cc}=5.0$ v. The OUTB voltage will be down by a voltage $V_{BE}$ (the drop across a forward-biased base-emitter junction) from this or approximately 3.8 v. Meanwhile, with no current flow in the other load resistor M6/R6, the voltage at the collector of Q8 and at the base of Q10 will be $V_{cc}$. The OUT voltage will be $V_{BE}$ down from this or approximately 4.2 v. The Q7 emitter (and Q4 collector) will be down from 4.6 v by the CE drop across Q7 with the calibrated current going through it. Since IN will be approximately the same as OUT (4.2 v), and since IN will be $V_{BE}$ above the Q7 emitter voltage, it is seen that this emitter voltage is approximately 3.4 v.

With Q7 conducting (IN high, ≈4.2 v), capacitor CX1 will be charged in accord with the CV=Q relationship. In the Preferred Embodiment $V \approx 0.4$ v and CX1 is typically a few hundred femtofarads, with the parasitic capacitance adding another 100 to 150 femtofarads. With a typical value for the load resistive element of 2000 ohms, the RC value is on the order of 500 picoseconds. Within the context of the Preferred Embodiment, these values can be varied. Typically, with the numbers stated, there would be 14 of the delay cells cascaded to form a delay line with a total propagation delay of 7 or 8 nanoseconds.

With the circuit powered up, a tightly specified current will be generated. The current-setting reference voltage, $V_{ref1}$—also provided by some known means such as a Widler band gap voltage reference cell, not shown—is approximately 1.28 v in the Preferred Embodiment and is referenced to the low-potential power rail GND. The single off-chip precision resistor $R_p$ will be selected to specify this current, and ultimately the calibrated resistance. An operational amplifier OP-AMP$_1$ output biases the gate of the P-Channel resistor M1 so that the source-to-drain current of that resistor, passing to GND through the off-chip resistor $R_p$, biases the non-inverting (+) input of OP-AMP1 to the same value as $V_{refl}$. This M1 current is then mirrored to P-Channel resistor M2, designated the "current scaling resistor" since it is designed to be identical to M1 but for a scale factor. In the Preferred Embodiment this scale factor is approximately 5, so that the current through M2—and Q2—is approximately 5 times the current set in M1. This M2 current is then used to generate a base-biasing voltage $V_{BASE}$, which in turn causes a mirrored current proportional to the calibrated current to flow through the transistor Q3 and its corresponding series resistors R3. In the Preferred Embodiment, Q3 is 1/5 the size of Q2, so that the current mirrored into Q3 is indeed the calibrated current flowing in M1. This current is also mirrored into the branches in the delay cell itself containing the transistors Q4, Q5, and Q6, all identical to Q3. (More generally, Q5 and Q6 could vary from Q3 by a scaling factor.) Similarly, the resistors in these branches—R7, R8, and R9—are identical to R3. R2=R3/5.

Figure 6:
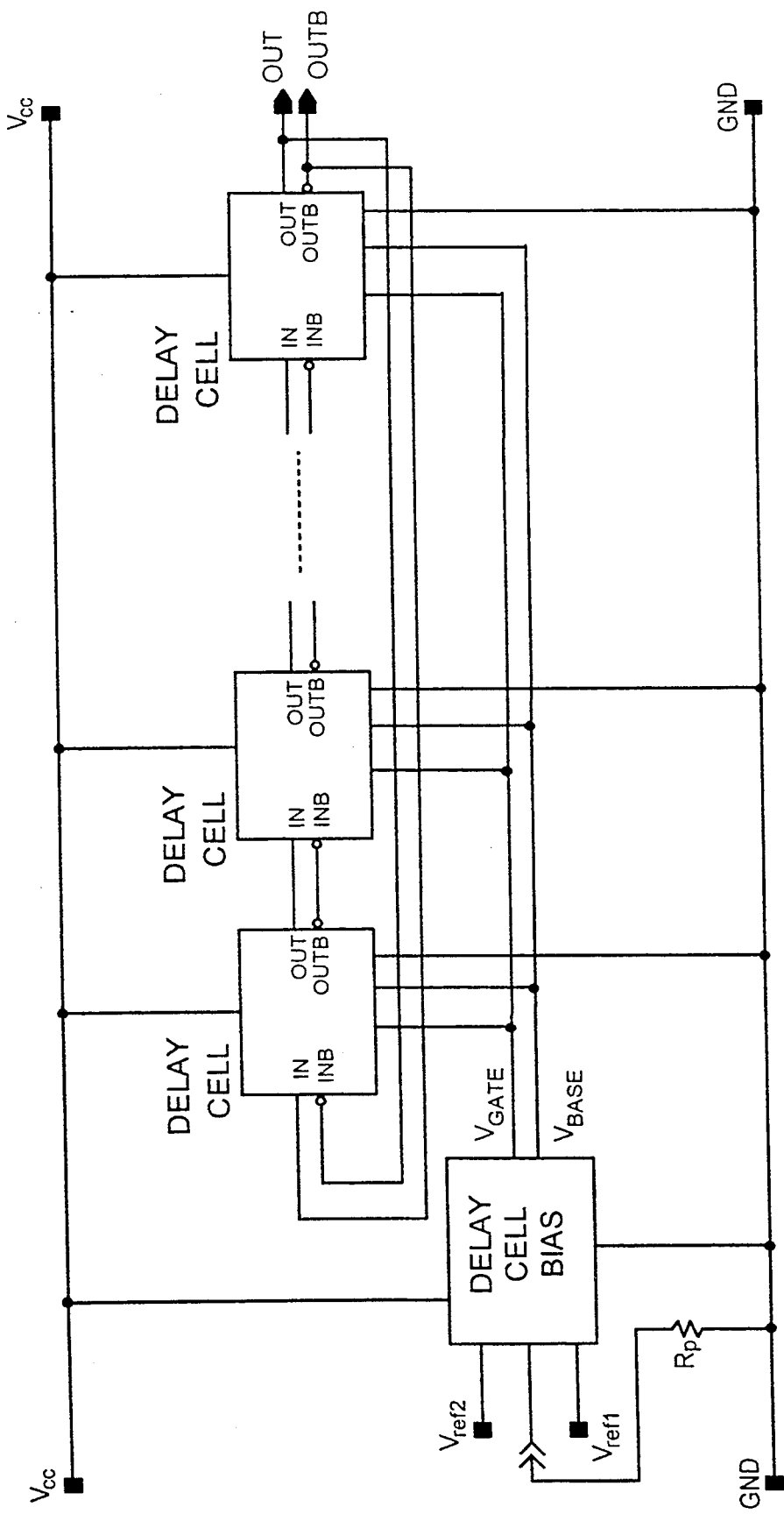
FIG. 6 is a block schematic of a voltage-controlled-ring-oscillator based on the present invention.

FIG. 6 is a block schematic depicting how the delay cell of the present invention can be cascaded into a delay line and then into a VCRO. As indicated, a single Delay Cell Bias circuit provides the $V_{GATE}$ and $V_{BASE}$ biases for all of the Delay Cells. It is also the single Delay Cell Bias circuit that-in conjunction with an off-chip precision resistor—generates the calibrated resistance and the calibrated current that are mirrored into every Delay Cell in the delay line utilized by the VCRO. It is of course the direct feedback from OUT and OUTB to IN and INB that establishes the oscillation of this circuit.

I claim:

1. A calibrated-resistance device comprising a master resistive element, one or more slave resistive elements, a means for imparting a specific resistance to said master resistive element, and a means for mirroring said specific resistance to each of said slave resistive elements.

2. Calibrated-resistance device as claimed in claim 1, wherein said master resistive element and said slave resistive elements are nominally-identical to one another with each comprising a voltage-controllable resistor wherein said voltage-controllable resistor contains a voltage-sensitive input, said means for imparting a specific resistance comprising a resistance-setting operational amplifier,
   a means for coupling a constant voltage reference source to an inverting input of said resistance-setting operational amplifier,
   coupling a high-potential end of said master resistive element directly to a high-potential power rail,
   means for producing a calibrated current through said master resistive element to a low-potential power rail,
   means for producing said calibrated current through said slave resistive elements to said low-potential power rail,
   coupling a low-potential end of said master resistive element to an inverting input of said operational amplifier,
   and coupling an output of said resistance-setting operational amplifier to said voltage-sensitive input of said master resistive element and to said voltage-sensitive input of each of said slave resistive elements.

3. Calibrated-resistance device as claimed in claim 2, wherein said master resistive element is comprised of a MOSFET resistor coupled in parallel to a fixed resistor and wherein a control gate of said MOSFET resistor comprises said voltage-sensitive input and wherein said calibrated current is of such magnitude as to ensure that said specific resistance of said master resistive element is nominally constant for small variations in voltage drop between said high-potential power rail and said low-potential end of said master resistive element.

4. Calibrated-resistance device as claimed in claim 3, wherein said calibrated current is produced by coupling said low-potential end of said master resistive element to said low-potential power rail through a series-connected master-resistance-bias transistor and a master-resistance-bias resistor, wherein a base node of said master-resistance-bias transistor is coupled to a calibrated base voltage source, and wherein each of said slave resistive elements is coupled to said low-potential power rail through a series-connected slave-resistance-bias transistor and a slave-resistance-bias resistor, wherein each said slave-resistance-bias transistor is nominally identical to said master-bias-transistor and wherein each said slave-resistance-bias resistor is nominally identical to said master-bias-resistor, and wherein each said slave-resistance-bias transistor is base-biased by said calibrated base voltage source.

5. Calibrated-resistance device as claimed in claim 4 also comprising a master-current-P-Channel resistor, a current-scaling P-Channel resistor, a current-setting operational amplifier, means for coupling a current-setting reference voltage to an inverting input of said current-setting operational amplifier, means for coupling an off-chip precision resistor to a non-inverting input of said current-setting operational amplifier, and a buffer transistor, wherein said calibrated base voltage source is an emitter voltage of said buffer transistor,
   wherein a collector node of said buffer transistor is connected directly to said high-potential voltage rail and an emitter node of said buffer transistor is connected to said low-potential power rail through a buffer resistor, wherein a collector of said master-bias-transistor is connected to a base of said buffer transistor,
   wherein a drain node of said master-current-calibrating P-Channel resistor is coupled directly to said non-inverting input of said current-setting operational amplifier,
   and wherein an output of said current-calibrating operational amplifier is coupled directly to a control gate node of said master-current-calibrating P-Channel resistor and also to a control gate node of said current-scaling P-Channel resistor.

6. An ECL delay cell comprising
   an output and a complementary output,
   a first output transistor and a second output transistor nominally-identical to said first output transistor,
      wherein said output is coupled directly to an emitter node of said second output transistor and said complementary output is coupled directly to an emitter node of said first output transistor,
   wherein said emitter node of said first output transistor is coupled directly to a first-output-current-generator means for ensuring that a first-output-calibrated-current flows from said emitter node of said first output transistor to a low-potential power rail through a first-biasing-resistor, and said emitter node of said second output transistor is coupled directly to a second-output-current-generator means for ensuring that a second-output-calibrated-current flows from said emitter node of said second output transistor to said low-potential power rail through a second-biasing-resistor, and wherein said first output-calibrated-current is nominally identical to said second output-calibrated-current and, to within a scaling factor, to a calibrated tail current.

7. The ECL delay cell as claimed in claim 6 having a first load resistor comprising a first load P-Channel resistor in parallel with a first load diffusion resistor, a second load resistor comprising a second load P-Channel resistor in parallel with a second load diffusion resistor, a tail circuit comprising a tail transistor in series with a tail resistor, means for maintaining a calibrated tail current comprising a calibrated base voltage to a base node of said tail transistor, first output-current-generator means comprising a first output-current- generator-transistor wherein a base node of said first output-current-generator-transistor is coupled to said calibrated base voltage, said second output-current-generator means comprising a second output-current-generator-transistor wherein a base node of said second output-current-generator-transistor is coupled to said calibrated base voltage.

8. A delay circuit comprising an ECL delay buffer and a delay bias circuit,
said delay buffer having
an input and a complementary input,
an output and a complementary output,
a first input transistor,
a second input transistor,
a first output transistor,
a second output transistor,
a first slave resistive element comprising a first slave P-Channel resistor,
a first RC capacitor coupled in parallel to said first slave resistive element,
a second slave resistive element comprising a second P-Channel resistor,
wherein said second slave resistive element is nominally identical to said first slave resistive element,
a second RC capacitor coupled in parallel to said second slave resistive element, wherein said second RC capacitor is nominally identical to said first RC capacitor,
an ECL tail circuit comprising a tail resistor in series with a tail transistor,
a first emitter-biasing resistor coupled between a low-potential power rail and an emitter node of a first emitter-biasing transistor,
a second emitter-biasing resistor coupled between said low-potential power rail and an emitter node of a second emitter-biasing transistor,
said delay bias circuit having
a first operational amplifier,
a second operational amplifier,
a master resistive element comprising a master P-Channel resistor, a buffering transistor,
an external node for coupling a non-inverting input of said first operational amplifier to said low potential power rail through an off-chip precision resistor,
a master current P-Channel resistor,
a current scaling P-Channel resistor,
means for coupling a first reference voltage to an inverting input of said first operational amplifier,
means for coupling a second reference voltage to an inverting input of
said second operational amplifier,
a first slave current element comprising a first slave current transistor,
coupled in series with a first slave current resistor,
a second slave current element comprising a second slave current transistor coupled in series with a second slave current resistor,
wherein said input is coupled to a base node of said first input transistor, said complementary input is coupled to a base node of said second input transistor, said output is coupled to an emitter node of said second output transistor, said complementary output is coupled to an emitter node of said first output transistor, said first output transistor is coupled between a high-potential power rail and a collector node of said first emitter-biasing transistor, said second output transistor is coupled between said high-potential power rail and a collector node of said second emitter-biasing transistor, said tail resistor is coupled between said low-potential ground rail and an emitter node of said tail transistor, a collector node of said tail transistor is coupled to an emitter node of said first input transistor and to an emitter node of said second input transistor, said first RC capacitor is coupled between said high-potential power rail and a collector node of said first input transistor, said second RC capacitor is coupled between said high-potential power rail and a collector node of said second input transistor,
wherein an output node of said second operational amplifier is coupled to a gate of said master P-Channel resistor and also to a gate of said first slave P-Channel resistor and to a gate of said second slave P-Channel resistor, and a drain of said master P-Channel resistor is connected to a noninverting input of said second operational amplifier,
wherein a source node of said master current P-Channel resistor is coupled directly to said high-potential power rail and a drain node of said master current P-Channel resistor is coupled directly to said non-inverting input of said first operational amplifier,
wherein an output node of said first operational amplifier is coupled to a gate node of said master current P-Channel resistor and to a gate node of said current-scaling P-Channel resistor, wherein said master P-Channel resistor is nominally identical within a scaling factor to said current-scaling P-Channel resistor,
wherein a source node of said scaling P-Channel resistor is coupled directly to said high-potential power rail and wherein a drain node of said current-scaling P-Channel resistor is coupled directly to a collector of said first slave current transistor and to a base of said buffering transistor,
wherein a collector of said buffering transistor is connected to said high-potential power rail and wherein an emitter of said buffering transistor is connected to ground through a first resistor and also to a base node of said first slave current transistor, a base node of said second slave current transistor, a base node of said tail transistor, a base node of said first emitter-biasing transistor, and to a base node of said second emitter-biasing transistor,
and wherein said master resistive element is nominally identical to said first slave resistive element and to said second slave resistive element.

9. A delay circuit as claimed in claim 8, said first slave resistive element also comprising a first slave diffusion resistor coupled in parallel with said first slave P-Channel resistor, said second slave resistive element also comprising a second slave diffusion resistor coupled in parallel with said second slave P-Channel resistor, and said master resistive element also comprising a master diffusion resistor coupled in parallel with said master P-Channel resistor.

10. A voltage-controlled-ring-oscillator comprising a calibrated-resistance device comprising a master resistive element, one or more slave resistive elements, a means for imparting a specific resistance to said master resistive element, and a means for mirroring said specific resistance to each of said slave resistive elements.

11. A method of creating a calibrated delay in an output signal of a circuit having an output and a calibrated-resistance device comprising the steps of:
   a. introducing a calibrated current to a master resistive element of said calibrated-resistance device and to one or more slave resistive elements of said calibrated-resistance device;
   b. setting a calibrated master resistance of said master resistive element;
   c. mirroring said calibrated master resistance onto said slave resistive elements; and
   d. coupling said slave resistive elements to said output, wherein said calibrated current is utilized in setting said calibrated master resistance and in mirroring said calibrated master resistance to said slave resistive elements.

12. The method as claimed in claim 11 wherein said master resistive element and said slave resistive elements are nominally identical to one another, each comprising a voltage-controllable resistor, said voltage-controllable resistor having a voltage-sensitive input, wherein the step of setting a calibrated master resistance comprises the steps of:
   a. coupling a constant voltage reference source to an inverting input of a resistance-setting operational amplifier of said calibrated-resistance device;
   b. coupling a high-potential end of said master resistive element directly to a high-potential power rail;
   c. producing a calibrated current through said master resistive element to a low-potential power rail;
   d. producing said calibrated current through said slave resistive elements to said low-potential power rail;
   e. coupling a low-potential end of said master resistive element to a noninverting input of said resistance-setting operational amplifier; and
   f. coupling an output of said resistance-setting operational amplifier to said voltage-sensitive input of said master resistive element and to said voltage-sensitive input of each of said slave resistive elements.

13. The method as claimed in claim 12 wherein said master resistive element comprises a MOSFET resistor coupled in parallel to a fixed resistor and wherein a control gate of said MOSFET resistor is said voltage-sensitive input of said master resistive element, further comprising the step of setting said calibrated current so as to ensure that said calibrated master resistance of said master resistive element is nominally constant for small variations in voltage drop between said high-potential power rail and said low-potential end of said master resistive element.

14. The method as claimed in claim 13 wherein the step of producing said calibrated current through said master resistive element comprises:
   a. coupling said low-potential end of said master resistive element to said low-potential power rail through a series-connected master-resistance-bias transistor and a master-resistance-bias resistor;
   b. coupling a base node of said master-resistance-bias transistor to a calibrated voltage source; and
   c. coupling each of said slave resistive elements to said low-potential power rail through a corresponding series-connected slave-resistance-bias transistor and a corresponding slave-resistance-bias resistor.

15. The method as claimed in claim 14 wherein each of said slave-resistance-bias transistors is nominally identical to said master-resistance-bias transistor, and wherein each of said slave-resistance-bias resistor is nominally identical to said master-resistance-bias resistor, and wherein each of said slave-resistance-bias transistor is base-biased by said calibrated base voltage source.

16. The method as claimed in claim 15, said calibrated-resistance device further having a master-current-P-channel resistor, a current-scaling-P-channel resistor, a current-setting operational amplifier, and a buffer transistor, wherein said calibrated base voltage source is an emitter voltage of said buffer transistor, further comprising the steps of:
   a. coupling a current-setting reference voltage to an inverting input of said current-setting operational amplifier;
   b. coupling an off-chip precision resistor to a non-inverting input of said current-setting operational amplifier;
   c. connecting a collector node of said buffer transistor to said high-potential power rail and an emitter node of said buffer transistor to said low-potential power rail through a buffer resistor;
   d. connecting a collector of said master-resistance-bias transistor to a base of said buffer transistor;
   e. coupling a drain node of said master-current P-channel resistor to said non-inverting input of said current-setting operational amplifier; and
   f. coupling an output of said current-setting operational amplifier to a control gate node of master-current P-channel resistor and to a control gate node of current-scaling P-channel resistor.

17. A method of creating a calibrated delay at an output of an ECL delay cell, said ECL delay cell having an output and a complementary output, a first output transistor, and a second output transistor, wherein said second output transistor is nominally identical to said first output transistor, comprising the steps of:
   a. coupling said output to an emitter node of said second output transistor;
   b. coupling said complementary output to an emitter node of said first output transistor;
   c. ensuring that a first-output-calibrated-current flows from said emitter node of said first output transistor to a low-potential power rail;
   d. ensuring that a second-output-calibrated-current flows from said emitter node of said second output transistor; and
   e. maintaining a calibrated tail current to said low-potential power rail.

18. The method as claimed in claim 17 wherein the step of maintaining a calibrated tail current to said low-potential power rail comprises introducing a calibrated base voltage to a base node of a tail transistor of a tail circuit of said ECL delay cell, wherein said tail circuit is coupled to a common input node of said ECL delay cell.

19. The method as claimed in claim 18 wherein the steps of ensuring that a first-output-calibrated-current and a second-output-calibrated-current flow comprise:
   a. coupling said emitter node of said first output transistor to a first-output-current-generator-transistor;
   b. coupling said emitter node of said second output transistor to a second-output-current-generator-transistor; and
   c. coupling a base node of said first-output-current-generator-transistor and a base node of said second-output-current-generator-transistor to said calibrated base voltage.

20. The method as claimed in claim 18 further comprising the steps of:
   a. coupling said first output transistor to said low-potential power rail through a first-biasing-resistor; and
   coupling said second output transistor to said low-potential power rail through a second-biasing-resistor.

* * * * *